United States Patent
Lee et al.

(10) Patent No.: US 11,682,563 B2
(45) Date of Patent: Jun. 20, 2023

(54) SEMICONDUCTOR DEVICE ASSEMBLY WITH GRADED MODULUS UNDERFILL AND ASSOCIATED METHODS AND SYSTEMS

(71) Applicant: Micron Technology, Inc., Boise, ID (US)

(72) Inventors: Jungbae Lee, Taichung (TW); Chih Hong Wang, Taichung (TW)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/850,978

(22) Filed: Jun. 27, 2022

(65) Prior Publication Data
US 2022/0328326 A1 Oct. 13, 2022

Related U.S. Application Data

(63) Continuation of application No. 17/007,607, filed on Aug. 31, 2020, now Pat. No. 11,404,289.

(51) Int. Cl.
*H01L 21/56* (2006.01)
*H01L 23/29* (2006.01)
(Continued)

(52) U.S. Cl.
CPC .......... *H01L 21/563* (2013.01); *H01L 23/295* (2013.01); *H01L 23/3157* (2013.01);
(Continued)

(58) Field of Classification Search
CPC ..................................................... H01L 21/563
See application file for complete search history.

(56) References Cited

U.S. PATENT DOCUMENTS 6,660,560 B2 * 12/2003 Chaudhuri .............. H01L 24/29
257/E21.503
6,899,948 B2 * 5/2005 Zhang ..................... A61K 6/30
428/407

(Continued)

OTHER PUBLICATIONS

Qu, J. et al., "Effective Elastic Modulus of Underfill Material for Flip-Chip Applications", IEEE Transactions on Components and Packaging Technologies, vol. 25, No. 1, Mar. 2002, pp. 53-55.

(Continued)

*Primary Examiner* — William A Harriston
(74) *Attorney, Agent, or Firm* — Perkins Coie LLP

(57) ABSTRACT

Underfill materials with graded moduli for semiconductor device assemblies, and associated methods and systems are disclosed. In one embodiment, the underfill material between a semiconductor die and a package substrate includes a matrix material, first filler particles with a first size distribution, and second filler particles with a second size distribution different than the first size distribution. Centrifugal force may be applied to the underfill material to arrange the first and second filler particles such that the underfill material may form a first region having a first elastic modulus and a second region having a second elastic modulus different than the first elastic modulus. Once the underfill material is cured, portions of conductive pillars coupling the semiconductor die with the package substrate may be surrounded by the first region, and conductive pads of the package substrate may be surrounded by the second region.

20 Claims, 5 Drawing Sheets

(51) Int. Cl.
*H01L 23/31* (2006.01)
*H01L 23/00* (2006.01)
(52) U.S. Cl.
CPC .............. *H01L 24/05* (2013.01); *H01L 24/13* (2013.01); *H01L 24/16* (2013.01); *H01L 24/81* (2013.01); *H01L 2224/05147* (2013.01); *H01L 2224/05647* (2013.01); *H01L 2224/13147* (2013.01); *H01L 2224/16227* (2013.01); *H01L 2224/16501* (2013.01); *H01L 2224/8192* (2013.01)

(56) References Cited

U.S. PATENT DOCUMENTS

| | | | |
|---|---|---|---|
| 7,498,197 B2 * | 3/2009 | Basheer | ................ H01L 21/563 438/126 |
| 2015/0371916 A1 | 12/2015 | Barr et al. | |
| 2022/0068666 A1 | 3/2022 | Lee et al. | |

OTHER PUBLICATIONS

TW Patent Application No. 110131986—Taiwanese Office Action and Search Report, dated Sep. 28, 2022, with English Translation, 14 pages.

* cited by examiner

SEMICONDUCTOR DEVICE ASSEMBLY WITH GRADED MODULUS UNDERFILL AND ASSOCIATED METHODS AND SYSTEMS

CROSS-REFERENCE TO RELATED APPLICATION(S)

This application is a continuation of U.S. patent application Ser. No. 17/007,607, filed Aug. 31, 2020; which is incorporated herein by reference in its entirety.

TECHNICAL FIELD

The present disclosure generally relates to semiconductor device assemblies, and more particularly relates to graded modulus underfill for semiconductor device assemblies.

BACKGROUND

Semiconductor packages typically include a semiconductor die (e.g., memory chip, microprocessor chip, imager chip, etc.) mounted on a package substrate and encased in a protective covering. The semiconductor die may include functional features, such as memory cells, processor circuits, or imager devices, as well as bond pads electrically connected to the functional features. The bond pads can be electrically connected to corresponding conductive structures of the substrate, which may be coupled to terminals outside the protective covering such that the semiconductor die can be connected to higher level circuitry.

Market pressures continually drive semiconductor manufacturers to reduce the size of semiconductor packages to fit within the space constraints of electronic devices. In some semiconductor packages, direct chip attach methods (e.g., flip-chip bonding between the semiconductor die and the package substrate) may be used to reduce the footprint of the semiconductor packages. Such direct chip attach methods may include directly connecting multiple conductive pillars electrically coupled to the semiconductor die to corresponding conductive structures (e.g., conductive pads) of the substrate. Further, a solder structure may be formed over individual conductive pillars for bonding the conductive pillars to the corresponding conductive structures—e.g., forming interconnects (which may be referred to as joints) that each include the conductive pillar, the solder structure, and the conductive pad.

BRIEF DESCRIPTION OF THE DRAWINGS

Many aspects of the present technology can be better understood with reference to the following drawings. The components in the drawings are not necessarily to scale. Instead, emphasis is placed on illustrating clearly the principles of the present technology.

DETAILED DESCRIPTION

Figure 1:
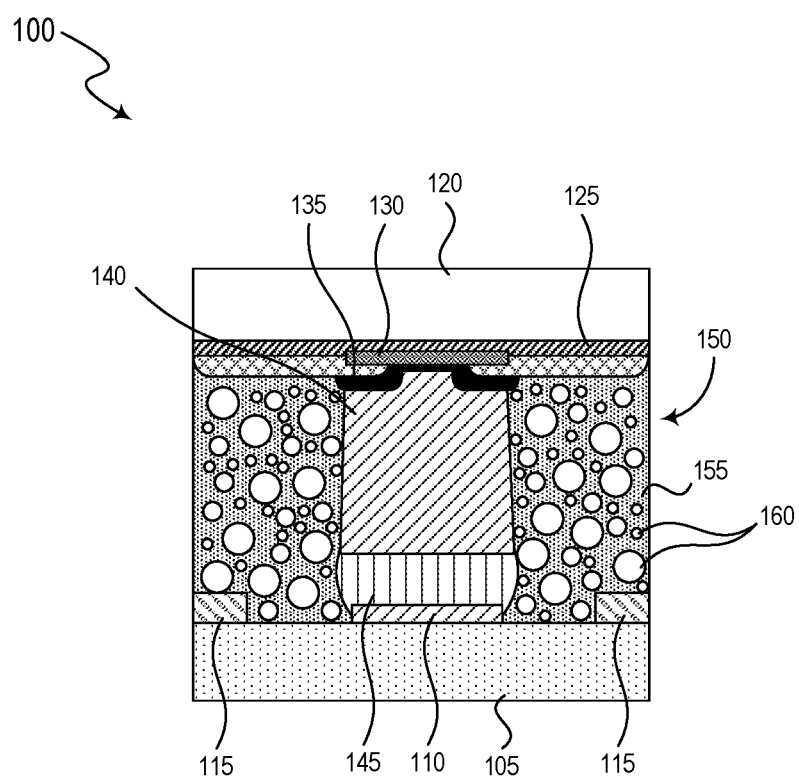
FIG. 1 is a cross-sectional view of a semiconductor device assembly.

Specific details of several embodiments directed to underfill materials with graded moduli for semiconductor device assemblies, and associated systems and methods are described below. Some semiconductor dies (e.g., DRAM) include integrated circuitry and bond pads electrically coupled to the integrated circuitry. Conductive pillars may be formed on (e.g., electrically coupled to) the bond pads such that the conductive pillars can be directly connected to conductive pads (or conductive bumps) on a package substrate via solder structures. The conductive pillars and solder structures define interconnects extending from the package substrate to the semiconductor die—e.g., a direct chip attach (DCA) scheme, a flip-chip bonding scheme, etc. In general, the coefficient of thermal expansion (CTE) of the package substrate tends to be greater than the semiconductor die. The CTE mismatch may cause excessive stress to the interconnects during various processing steps and/or under operating conditions. This can result in open-circuit failures and/or reliability issues due to fatigue of the interconnects.

The semiconductor devices have an underfill material between the semiconductor die and the package substrate to provide additional mechanical coupling and constrain the stresses of the CTE mismatch. A stiff underfill material (e.g., underfill materials with relatively large elastic moduli) may be beneficial to protect the interconnects, but they may re-distribute local stress (e.g., due to the CTE mismatch) to the semiconductor die such that the semiconductor die may develop cracks at dielectric layers including low-k materials or other defects. A flexible underfill material (e.g., underfill materials with relatively small elastic moduli) may be beneficial to avoid such defects in the semiconductor dies, but may be inefficient to protect the interconnects.

The present technology can provide underfill materials with graded elastic moduli or other physical parameters such that a relatively stiff region of the underfill material (i.e., with a relatively large elastic modulus) is proximate the conductive pad of the package substrate to protect the solder joint from undue stress while a relatively flexible region of the underfill material (i.e., with a relatively small elastic modulus) is proximate the semiconductor die to prevent defects from developing in the semiconductor die. In some embodiments, the underfill material may be part of an encapsulation material for the semiconductor device assemblies. In some embodiments, the underfill material includes a matrix material (e.g., an epoxy based polymer material) and filler particles with at least two different size distributions. When the underfill material is initially disposed in the space between the semiconductor die and the package substrate, the filler particles may be randomly dispersed within the matrix material. As described in more details below, the present technology can arrange the filler particles based on their sizes such that the underfill material, after being cured, can have at least two regions including a first region having a relatively large elastic modulus and a second region having a relatively small elastic modulus, respectively, thereby forming the underfill materials with graded moduli.

The term "semiconductor device or die" generally refers to a solid-state device that includes one or more semiconductor materials. Examples of semiconductor devices include logic devices, memory devices, microprocessors, or diodes, among others. Such semiconductor devices may include integrated circuits or components, data storage elements, processing components, and/or other features manufactured on semiconductor substrates. Further, the term "semiconductor device or die" can refer to a finished device or to an assembly or other structure at various stages of processing before becoming a finished device. Depending upon the context in which it is used, the term "substrate" can refer to a wafer-level substrate or to a singulated, die-level substrate. Also, a substrate may include a semiconductor wafer, a package support substrate, a package substrate, an interposer, a semiconductor device or die, or the like. A person having ordinary skill in the relevant art will recognize that suitable steps of the methods described herein can be performed at the wafer level or at the die level.

Further, unless the context indicates otherwise, structures disclosed herein can be formed using conventional semiconductor-manufacturing techniques. Materials can be deposited, for example, using chemical vapor deposition, physical vapor deposition, atomic layer deposition, spin coating, plating, and/or other suitable techniques. Similarly, materials can be removed, for example, using plasma etching, wet etching, chemical-mechanical planarization, or other suitable techniques. Some of the techniques may be combined with photolithography processes. A person skilled in the relevant art will also understand that the technology may have additional embodiments, and that the technology may be practiced without several of the details of the embodiments described herein with reference to FIGS. 2 through 5.

As used herein, the terms "vertical," "lateral," "down," "up," "upper," and "lower" can refer to relative directions or positions of features in the semiconductor device assemblies in view of the orientation shown in the Figures. For example, "upper" or "uppermost" can refer to a feature positioned closer to the top of a page than another feature. These terms, however, should be construed broadly to include semiconductor devices having other orientations.

FIG. 1 is a cross-sectional view of a semiconductor device assembly 100 having a package substrate 105 and a semiconductor die 120 attached thereto. The semiconductor device assembly 100 also illustrates a solder mask 115 formed on the package substrate 105, a conductive pillar 140, an underfill material 150 including a matrix material 155 and filler particles 160. The package substrate 105 includes a conductive bump or a conductive pad 110. The semiconductor die 120 may be regarded as "flipped"—e.g., an active surface including various functional features of the semiconductor die 120 faces the substrate 105.

The semiconductor die 120 may include integrated circuitry and a contact pad or a bond pad 130 electrically coupled to the integrated circuitry. In some embodiments, the bond pad 130 is located at a low-k dielectric layer 125 that can reduce parasitic capacitances associated with the bond pad 130. The conductive pillar 140 is electrically coupled to the bond pad 130. In some embodiments, a conductive adhesive material 135 is disposed between the conductive pillar 140 and the bond pad 130 to further secure the conductive pillar 140 to the bond pad 130. The conductive pillar 140 can be coupled to the conductive pads 110 (e.g., bonded, conjoined) through a solder connector 145 to electrically couple the semiconductor die 120 to the package substrate 105. In some embodiments, the conductive pillar 140 and the conductive pad 110 include copper, and the solder connector 145 includes a conductive bond material comprising solder (e.g., a solder material, TiN based alloy). In some embodiments, a barrier material (e.g., a nickel-based alloy, not shown) may be disposed between the conductive pillar 140 and the solder connector 145. Although FIG. 1 depicts only one interconnect having a conductive pillar 140 and solder connector 145 electrically coupling the package substrate 105 and the semiconductor die 120, the semiconductor device assembly 100 has many such interconnects.

The underfill material 150 is a mixture of the matrix material 155 and the filler particles 160. The matrix material 155 may include epoxy based polymer materials, and may be referred to as an epoxy resin. The filler particles 160 can be added to the matrix material 155 to decrease the CTE of the underfill material 150 as a whole. For example, the matrix material 155 may have a CTE of about 85 ppm/° C. while silica-based filler particles may have a CTE of about 0.5 ppm/° C. The combination of the matrix material 155 and the filler particles 160 results in the underfill material 150 having a CTE range of, e.g., 25 to 70 ppm/° C. In this regard, as the weight percentage of the filler particles 160 in the underfill material 150 increases, the CTE of the underfill material 150 may decrease. Further, at a constant weight percentage of the filler particles 160, the filler particles 160 with smaller particle sizes may reduce the CTE of the underfill material 150 when compared to the filler particles 160 with larger particle sizes. A weight ratio of the filler particles 160 to the matrix material 155 may be referred to a filler loading. The CTE of the underfill material 150 generally relates to the elastic modulus (the modulus of elasticity) of the underfill material 150—e.g., the lower CTE, the higher elastic modulus (e.g., the stiffer underfill material 150), or vice versa.

In some embodiments, the filler particles 160 may include ceramic particles and/or silica particles. The sizes (particle sizes) of the filler particles 160 may vary, e.g., less than half (0.5) micrometer to greater than thirty (30) micrometers. Further, the particle sizes and distributions can be selected to obtain a desired CTE and corresponding elastic modulus of the underfill material 150. As depicted in FIG. 1, however, the filler particles 160 are randomly dispersed in the matrix material 155 such that the underfill material 150 has a uniform elastic modulus throughout its thickness.

Figure 2:
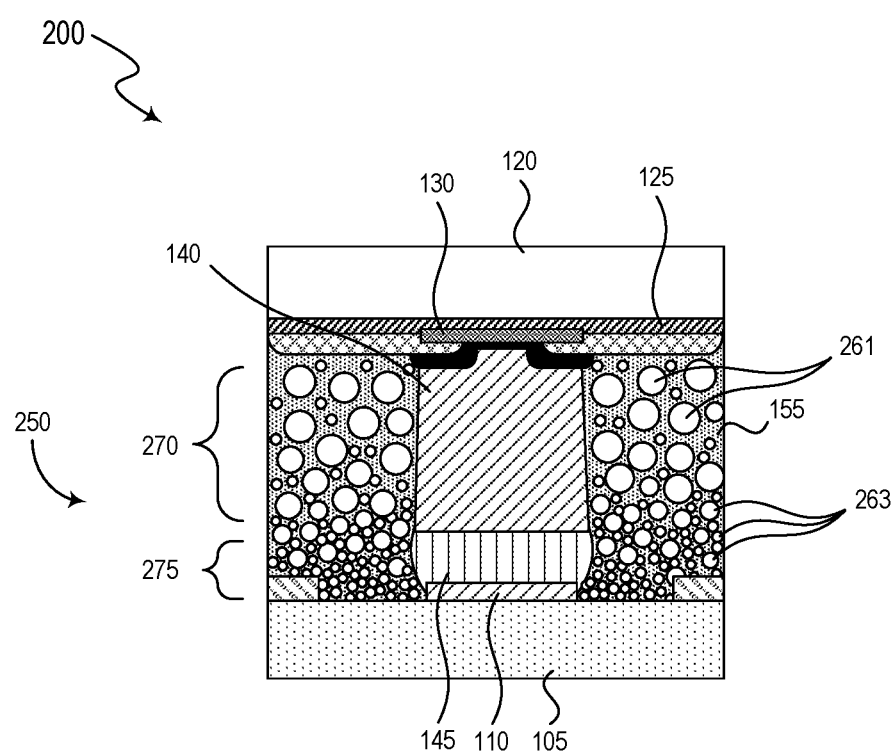
FIG. 2 is a cross-sectional view of a semiconductor device assembly in accordance with embodiments of the present technology.

FIG. 2 is a cross-sectional view of a semiconductor device assembly 200 in accordance with the present technology that includes an underfill material 250 with graded elastic moduli. The semiconductor device assembly 200 includes various components described with reference to FIG. 1, such as the substrate 105, the semiconductor die 120 attached to the substrate 105 through interconnects including the conductive pillar 140 and the solder connector 145.

The underfill material 250 may include the matrix material 155, first filler particles 261 having a first size distribution, and second filler particles 263 having a second size distribution different than (e.g., smaller than) the first size distribution. In some embodiments, the filler particles 160 described with reference to FIG. 1 may include the first filler particles 261 and the second filler particles 263 in a generally irregular or random distribution. As described in more details herein, the first and second filler particles 261 and 263 of the underfill material 250 are at least partially segregated (e.g., re-arranged from the random dispersion within the matrix material 155 as depicted in FIG. 1) to form a first region 270 including more of the first filler particles 261 than the second filler particles 263 and a second region 275 including more of the second filler particles 263 than the first filler particles 261.

The first region 270 including predominantly first filler particles 261 may be near the semiconductor die 120 and have a first modulus of elasticity. Similarly, the second region 275 including predominantly second filler particles 263 may be near the package substrate 105 and have a second modulus of elasticity. The second modulus of elasticity may be different than (e.g., greater than) the first modulus of elasticity.

The first region 270 of the underfill material 250 with the first modulus of elasticity surrounds at least a portion of the conductive pillar 140 at the semiconductor die 120. The second region 275 of the underfill material 250 with the second modulus of elasticity is at the conductive pad 110 of the package substrate 105 and at least a portion of the solder connector 145. The first region 270 having the first modulus of elasticity (e.g., less rigid than the second region 275) is thus proximate the semiconductor die 120 to inhibit defects in the semiconductor die 120 (e.g., cracks within or at interfaces of the low-k dielectric layer 125) and the second region 275 having the second modulus of elasticity (e.g., more rigid than the first region 270) is proximate the package substrate 105 to protect the interconnects (e.g., cracks within or at interfaces of the solder connector 145).

In some embodiments, particle sizes of the first and second filler particles 261, 263 may be based on the desired elastic moduli values for the semiconductor device assembly 200 in view of fabrication processes, testing processes, and/or operating conditions for the semiconductor device assembly 200. In this regard, the first particles 261 in the first region 270 of the underfill material 250 may have particle sizes greater than or equal to a threshold while the second particles 263 in the second region 275 of the underfill material 250 may have particle sizes less than the threshold. For example, the first size distribution includes particle sizes greater than or equal to five (5) micrometers, and the second size distribution includes particle sizes less than five (5) micrometers. In other embodiments, the threshold can be particle sizes of 1 µm-15 µm, including specifically 1 µm, 2 µm, 3 µm, 4 µm, 5 µm, 6 µm, 7 µm, 8 µm, 9 µm, 10 µm, 11 µm, 12 µm, 13 µm, 14 µm and 15 µm.

The underfill material 250 is not limited to having two regions, but rather the underfill material 250 may include three (3), four (4), or even more regions with different elastic moduli. Further, although the underfill material 250 is described as having at least two distinct regions in the foregoing examples, the underfill material 250 may include a gradually varying elastic modulus based on local variations in the weight ratio of the filler particles to the matrix material and/or the particle size distributions of the filler particles through the thickness of the underfill material 250.

Figure 3A:
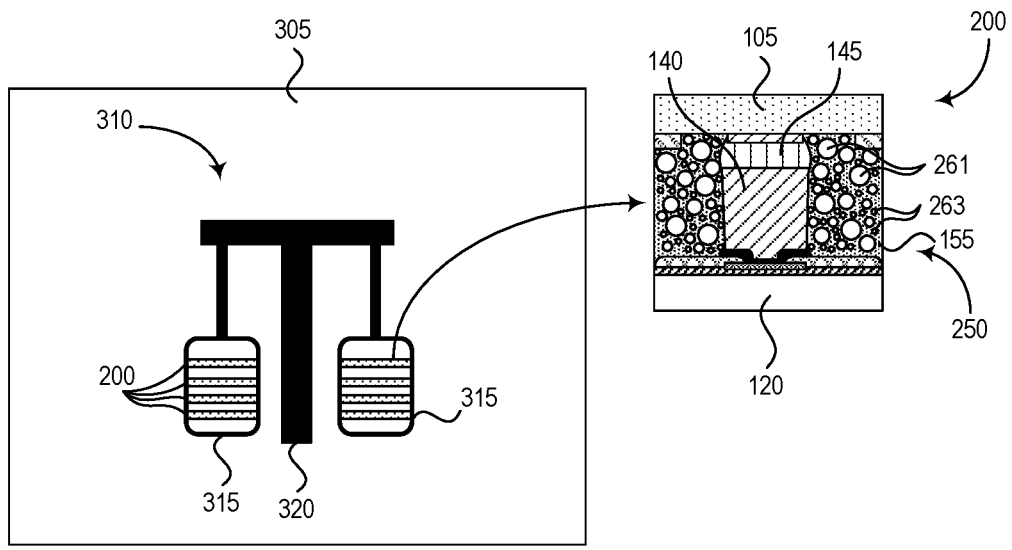
FIGS. 3A and 3B illustrate aspects of a process forming a semiconductor device assembly in accordance with embodiments of the present technology.
Figure 3B:
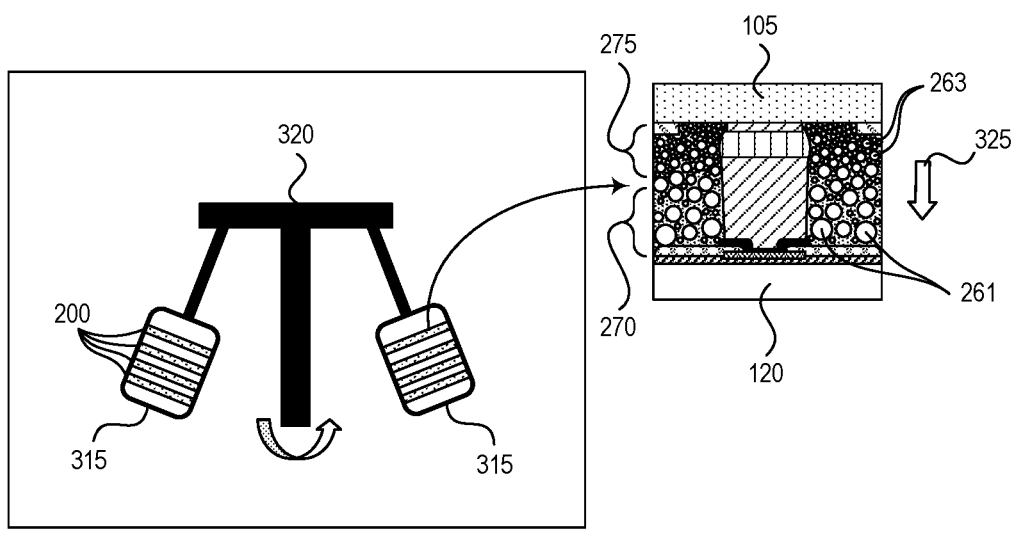

FIGS. 3A and 3B illustrate aspects of a process forming a semiconductor device assembly (e.g., the semiconductor device assembly 200) in accordance with embodiments of the present technology. FIG. 3A illustrates a chamber 305 including a centrifuge 310 with one or more magazines 315 and an axis of rotation 320. Each magazine 315 may be configured to initially contain one or more semiconductor device assemblies 200 before the first and second filler particles 261, 263 have been segregated into first and second regions 270 and 275. At this stage of the process, the first and second filler particles 261, 263 are randomly (e.g., irregularly) distributed in the matrix material 155. The semiconductor device assemblies 200 may be loaded to the magazine 315 such that the package substrate 105 is positioned above the semiconductor die 120 as depicted in FIG. 3A (i.e., inverted with respect to the semiconductor device assembly 200 shown in FIG. 2). In this manner, when the centrifuge 310 rotates to generate the centrifugal force 325, the package substrate 105 can be positioned nearer to the axis of rotation 320 than the semiconductor die 120 as depicted in FIG. 3B.

Since the first filler particles 261 have a first size distribution and the second filler particles 263 have a second size distribution different than the first size distribution, applying the centrifugal force 325 causes the first and second filler particles 261, 263 to separate from each other. For example, when the first size distribution of the first filler particles 261 is greater than the second size distribution of the second filler particles 263, the centrifugal force 325 causes the first filler particles 261 to preferentially flow through the matrix material 155 toward the semiconductor die 120. As a result, the first region 270 has more of the first filler particles 261 than the second filler particles 263 and the second region 275 has more of the second filler particles 263 than the first filler particles 261.

In some embodiments, the underfill material 250 may be heated to a first temperature (e.g., by heating the chamber 305) to lower the viscosity of the matrix material 155 while the centrifugal force 325 is applied to the underfill material 250. This allows the first filler particles 261 to more freely move through the matrix material 155. In some embodiments, the centrifugal force 325 may be applied for about one (1) hour at approximately 100° C. (e.g., within 10% of 100° C.). Subsequently, in some embodiments, the underfill material 250 may be cured at a second temperature (e.g., 150° C.+/−15° C., or +/−10° C. or +/−5° C.) greater than the first temperature. In some embodiments, the centrifugal force 325 may be applied during the curing period—e.g., for at least a portion of the curing period and/or using a different rotation speed (e.g., different magnitudes of the centrifugal force 325).

As a result of applying the centrifugal force 325 to the semiconductor device assemblies 200, the first and second filler particles 261, 263 in the underfill material 250 may be arranged to form at least two regions having different elastic moduli. As such, the underfill material 250 with graded moduli may be formed to mitigate the risk associated with developing defects in the semiconductor device assemblies 200—e.g., cracks in the low-k dielectric material and/or cracks in the interconnects.

Although the embodiments of FIGS. 2 and 3B are described as having the first region being near the semiconductor die and including the first filler particles with the first size distribution being greater than the second size distribution of the second filler particles in the second region near the package substrate 105, the present technology is not limited thereto. For example, the first and second regions in the filler material may be reversed by arranging the semiconductor device assembly in the magazine such that the semiconductor die can be positioned nearer to the axis of rotation than the package substrate. Such an arrangement with the first and second regions reversed with respect to the semiconductor die and the package substrate may be beneficial if the semiconductor die can sustain greater stress or strain than the interconnects—e.g., by replacing the low-k dielectric layer 125 with a more durable alternative dielectric material or by using an alternative bonding material in place of the current solder material (e.g., TiN based alloy). Further, the two or more kinds of filler particles having different physical properties (e.g., densities) may be used in the underfill material such that the filler particles with different physical properties may respond differently to the centrifugal force to form more desired configurations of the elastic moduli within the filler material optimized for the semiconductor device assemblies.

Figure 4:
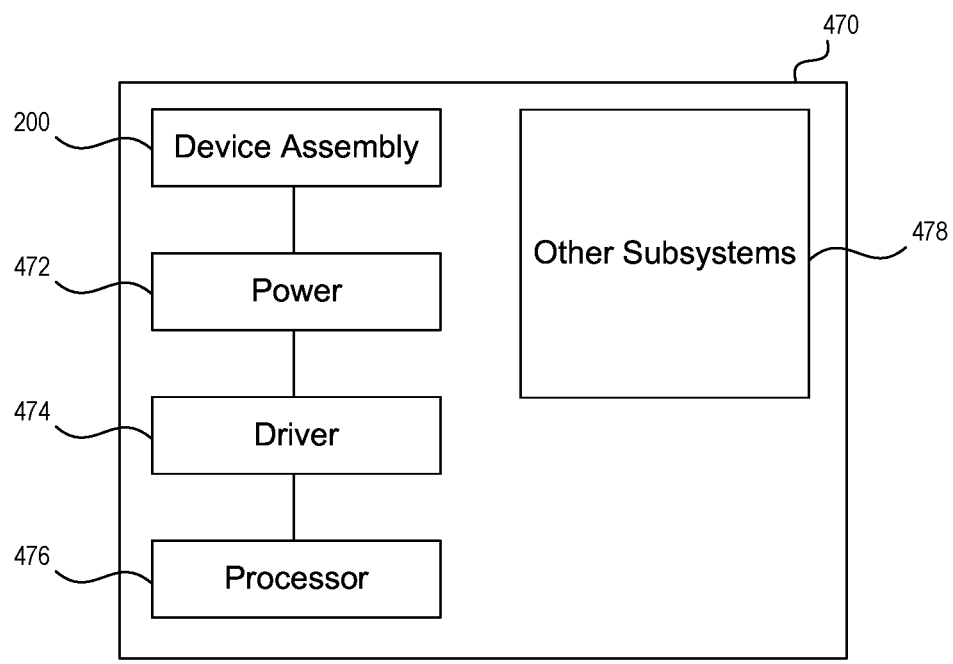
FIG. 4 is a block diagram schematically illustrating a system including a semiconductor device assembly configured in accordance with embodiments of the present technology.

The semiconductor die assembly 200 described with reference to FIG. 2 can be incorporated into any of a myriad of larger and/or more complex systems, a representative example of which is the system 470 shown schematically in FIG. 4. The system 470 can include the semiconductor device assembly 200, a power source 472, a driver 474, a processor 476, and/or other subsystems or components 478. The semiconductor device assembly 200 can include features described herein, such as an underfill material between a semiconductor die and a package substrate including at least a first region having a first modulus of elasticity and a second region having a second modulus of elasticity different than the first modulus, at least portions of conductive pillars coupling the semiconductor die with the package substrate surrounded by the first region of the underfill material, and conductive pads of the package substrate surrounded by the second region of the underfill material, among others. The resulting system 470 can perform any of a wide variety of functions, such as memory storage, data processing, and/or other suitable functions. Accordingly, representative systems 470 can include, without limitation, hand-held devices (e.g., mobile phones, tablets, digital readers, and digital audio players), computers, and appliances. Components of the system 470 may be housed in a single unit or distributed over multiple, interconnected units (e.g., through a communications network). The components of the system 470 can also include remote devices and any of a wide variety of computer readable media.

Figure 5:
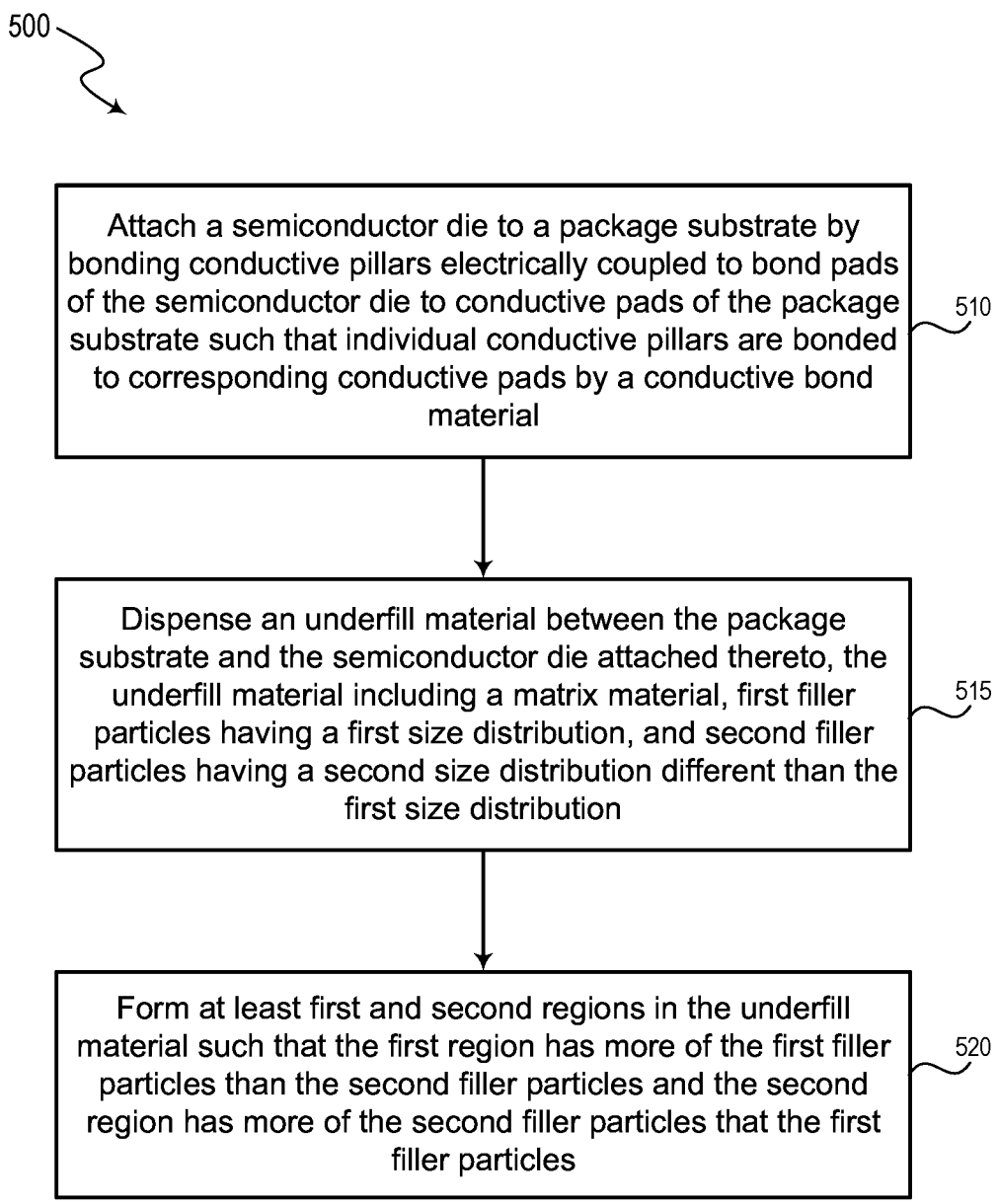
FIG. 5 is a flowchart of a method of forming a semiconductor device assembly in accordance with embodiments of the present technology.

FIG. 5 is a flowchart 500 of a method of forming a semiconductor device assembly (e.g., the semiconductor device assembly 200) in accordance with embodiments of the present technology. The flowchart 500 may include aspects of methods as described with reference to FIGS. 3A and 3B.

The method optionally includes attaching a semiconductor die to a package substrate by bonding conductive pillars electrically coupled to bond pads of the semiconductor die to conductive pads of the package substrate such that individual conductive pillars are bonded to corresponding conductive pads by a conductive bond material (box 510). The method further includes dispensing an underfill material between the package substrate and the semiconductor die. The underfill material includes a matrix material, first filler particles having a first size distribution, and second filler particles having a second size distribution different than the first size distribution (box 515). The method further includes forming at least first and second regions in the underfill material such that the first region has more of the first filler particles than the second filler particles and the second region has more of the second filler particles that the first filler particles (box 520).

In some embodiments, forming the at least two regions in the underfill material further includes applying a centrifugal force to the underfill material after the underfill material has been dispensed between the substrate and the semiconductor die attached thereto. In some embodiments, the method may further include arranging, prior to applying the centrifugal force, the package substrate and the semiconductor die attached thereto such that the package substrate is positioned nearer to an axis of rotation than the semiconductor die. In some embodiments, the method may further include heating the underfill material to a first temperature, wherein the centrifugal force is applied to the underfill material at the first temperature. In some embodiments, the method may further include curing the underfill material at a second temperature greater than the first temperature. In some embodiments, the method may further include applying the centrifugal force to the underfill material while curing the underfill material at the second temperature.

In some embodiments, the first region has a first modulus of elasticity corresponding to a first combination of the matrix material and the first filler particles, and the second region has a second modulus of elasticity corresponding to a second combination of the matrix material and the second filler particles, the second modulus of elasticity different than the first modulus. In some embodiments, at least portions of each individual conductive pillars are surrounded by the first region of the underfill material, and individual conductive pads and at least portions of the conductive bond material attached thereto are surrounded by the second region of the underfill material.

It should be noted that the methods described above describe possible implementations, and that the operations and the steps may be rearranged or otherwise modified and that other implementations are possible. Furthermore, embodiments from two or more of the methods may be combined. Further, it will be appreciated that specific embodiments of the technology have been described herein for purposes of illustration, but that various modifications may be made without deviating from the disclosure.

The devices discussed herein, including a semiconductor device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A semiconductor assembly, comprising:
   a package substrate;
   a semiconductor die attached to the package substrate by interconnects extending from the package substrate to the semiconductor die; and
   an underfill material between the semiconductor die and the package substrate, wherein the underfill material includes a matrix material and filler particles,
   wherein the underfill material includes a first region in which the filler particles have a first size distribution proximate the semiconductor die and a second region in which the filler particles have a second size distribution proximate the package substrate, and
   wherein the filler particles have a gradually varying size distribution from the first size distribution at the first region to the second size distribution at the second region.

2. The semiconductor assembly of claim 1, wherein the underfill material includes a gradually varying modulus of elasticity from a first modulus of elasticity at the first region to a second modulus of elasticity at the second region.

3. The semiconductor assembly of claim 2, wherein:
   a first combination of the matrix material and the filler particles with the first size distribution determines the first modulus of elasticity of the first region; and
   a second combination of the matrix material and the filler particles with the second size distribution determines the second modulus of elasticity of the second region.

4. The semiconductor assembly of claim 1, wherein the first size distribution comprises particle sizes greater than or equal to five micrometers, and the second size distribution comprises particle sizes less than five micrometers.

5. The semiconductor assembly of claim 1, wherein the filler particles comprise ceramic particles, silica particles, or a combination thereof.

6. The semiconductor assembly of claim 1, wherein:
   the filler particles in the first region of the underfill material have particle sizes greater than or equal to a threshold; and
   the filler particles in the second region of the underfill material have particle sizes less than the threshold.

7. The semiconductor assembly of claim 1, wherein individual interconnects comprise:
   a conductive pillar coupled to the semiconductor die, at least a portion of the conductive pillar surrounded by the first region of the underfill material; and
   a conductive pad of the package substrate coupled to a corresponding conductive pillar by a conductive bond material, the conductive pad and at least a portion of the conductive bond material surrounded by the second region of the underfill material.

8. The semiconductor assembly of claim 7, wherein the conductive pillar is coupled to a bond pad of the semiconductor die and the bond pad is at a low-k dielectric layer of the semiconductor die.

9. The semiconductor assembly of claim 7, wherein the conductive pillar and the conductive pad comprise copper, and the conductive bond material comprises a solder material.

10. A method, comprising:
    attaching a semiconductor die to a package substrate by bonding conductive pillars electrically coupled to bond pads of the semiconductor die to conductive pads of the package substrate such that individual conductive pillars are bonded to corresponding conductive pads by a conductive bond material;
    dispensing an underfill material between the package substrate and the semiconductor die attached thereto, the underfill material including a matrix material and filler particles; and
    forming at least first and second regions in the underfill material such that the filler particles have a gradually varying size distribution from a first size distribution at the first region to a second size distribution at the second region different than the first size distribution.

11. The method of claim 10, wherein forming the at least first and second regions in the underfill material further comprises:
    applying a centrifugal force to the underfill material after the underfill material has been dispensed between the substrate and the semiconductor die attached thereto.

12. The method of claim 11, further comprising:
    arranging, prior to applying the centrifugal force, the package substrate and the semiconductor die attached thereto such that the package substrate is positioned nearer to an axis of rotation than the semiconductor die.

13. The method of claim 11, further comprising:
    heating the underfill material to a first temperature, wherein the centrifugal force is applied to the underfill material at the first temperature.

14. The method of claim 13, further comprising:
    curing the underfill material at a second temperature greater than the first temperature.

15. The method of claim 14, further comprising:
    applying the centrifugal force to the underfill material while curing the underfill material at the second temperature.

16. The method of claim 10, wherein:
    the first region has a first modulus of elasticity corresponding to a first combination of the matrix material and the filler particles with the first size distribution; and
    the second region has a second modulus of elasticity corresponding to a second combination of the matrix material and the filler particles with the second size distribution, the second modulus of elasticity differing from the first modulus.

17. The method of claim 16, wherein:
    at least portions of each individual conductive pillars are surrounded by the first region of the underfill material; and
    individual conductive pads and at least portions of the conductive bond material attached thereto are surrounded by the second region of the underfill material.

18. A semiconductor assembly, comprising:
    a package substrate including conductive pads;
    a semiconductor die including integrated circuitry and bond pads electrically coupled to the integrated circuitry;
    conductive pillars, wherein individual conductive pillars are electrically coupled to a corresponding conductive pad of the package substrate and a corresponding bond pad of the semiconductor die; and
    an underfill material between the semiconductor die and the package substrate, wherein the underfill material includes a matrix material and filler particles, a first region in which the filler particles have a first size distribution proximate the semiconductor die and a second region in which the filler particles have a second size distribution proximate the package substrate, and wherein the filler particles have a gradually varying size distribution from the first size distribution at the first region to the second size distribution at the second region.

19. The semiconductor assembly of claim 18, wherein the underfill material includes a gradually varying modulus of elasticity from a first modulus of elasticity at the first region to a second modulus of elasticity at the second region.

20. The semiconductor assembly of claim 18, wherein:
at least portions of the individual conductive pillars are surrounded by the first region of the underfill material; and
individual conductive pads are surrounded by the second region of the underfill material.

* * * * *